(12) United States Patent
Chiou et al.

(10) Patent No.: US 8,784,930 B2
(45) Date of Patent: Jul. 22, 2014

(54) TRANSPARENT CONDUCTIVE FILM HAVING HIGH OPTICAL TRANSMITTANCE AND METHOD FOR MANUFACTURING THE SAME

(75) Inventors: Da-Ren Chiou, Taipei (TW); Wei-Che Hung, Taipei (TW); Shih-Yueh Lin, Taipei (TW); Chiu-Fang Chen, Taipei (TW); Tzu-Ying Chen, Taipei (TW)

(73) Assignee: Far Eastern New Century Corporation, Taipei (TW)

( * ) Notice: Subject to any disclaimer, the term of this patent is extended or adjusted under 35 U.S.C. 154(b) by 279 days.

(21) Appl. No.: 13/243,328

(22) Filed: Sep. 23, 2011

(65) Prior Publication Data
US 2012/0080218 A1 Apr. 5, 2012

(30) Foreign Application Priority Data
Sep. 30, 2010 (TW) .............................. 99133392 A

(51) Int. Cl.
*B05D 5/12* (2006.01)
*B05D 5/00* (2006.01)

(52) U.S. Cl.
USPC ............... 427/74; 427/58; 427/64; 427/256; 427/258; 427/259; 427/261; 427/282; 427/301

(58) Field of Classification Search
USPC ............... 427/58, 64, 74, 256, 258, 259, 261, 427/282, 301
See application file for complete search history.

(56) References Cited

U.S. PATENT DOCUMENTS

| 7,294,365 | B2 * | 11/2007 | Hayakawa et al. | 427/553 |
| 8,049,211 | B2 | 11/2011 | Tano et al. | |
| 2008/0124490 | A1 * | 5/2008 | Kobayashi | 427/597 |
| 2008/0156970 | A1 * | 7/2008 | Han et al. | 250/226 |
| 2008/0305349 | A1 * | 12/2008 | Nahm | 428/500 |
| 2010/0127706 | A1 * | 5/2010 | Itoh | 324/316 |

FOREIGN PATENT DOCUMENTS

TW 200905936 A 2/2009

* cited by examiner

*Primary Examiner* — Michael Cleveland
*Assistant Examiner* — Austin Murata
(74) *Attorney, Agent, or Firm* — Shimokaji & Associates, P.C.

(57) ABSTRACT

The present invention pertains to a transparent conductive film including a conductive layer having different thicknesses so as to increase the optical transmittance while maintaining the conductivity of the transparent conductive film. The present invention also pertains to a process for the preparation of the above-mentioned transparent conductive film.

9 Claims, 3 Drawing Sheets

TRANSPARENT CONDUCTIVE FILM HAVING HIGH OPTICAL TRANSMITTANCE AND METHOD FOR MANUFACTURING THE SAME

BACKGROUND OF THE INVENTION

1. Field of the Invention

The present invention relates to a transparent conductive film having high optical transmittance, and the transparent conductive film may be widely used in a transparent electrode of a touch panel, a liquid crystal display (LCD), an electronic-paper (E-Paper), a solar cell, an electronic induction display (EL), various soft electronic products having flexibility, and various electrical fields.

The present invention also relates to a method for preparing the above-mentioned transparent conductive film.

2. Description of the Prior Art

In recent years, a notebook computer and a mobile phone attached with a touch panel are getting more and more popular, and the industry also raises more requirements on a touch panel having excellent electrical and optical properties. A transparent conductive film is a key component of a touch panel, and a current manner for preparing a transparent conductive film is mainly a dry process, such as a vacuum evaporation method, a sputtering method, ion implantation, and a chemical vapor deposition method, but the dry process has the following problems.

(1) During a machining process and rolling sample storage, the surface of a thin film is easily ruptured, and the surface impedance is increased (such as a process disclosed in Japanese Patent Publication No. 2006-302562).

(2) The machine used is expensive and results in an increase of the cost during mass production (such as a process disclosed in Japanese Patent Publication No. 2008-059928).

However, a wet coating process for producing a transparent conductive film may solve the above-mentioned problems, and compared with the dry process, the production efficiency of the wet coating processes higher and the needed device is relatively simple. The conventional wet coating process is mainly to formulate a conductive material into a solution, and then coat the solution on a substrate, to form a conductive film.

Generally, an ordinary conductive material used in wet coating process includes graphene, poly(3,4-dialkoxythiophene), and carbon nanotube, but the above-mentioned materials all have a color, are uneasily manufactured into a conductive film having transparency, and are thus limited in applications. Therefore, it is an important topic to improve the transparency thereof.

Therefore, recently, the development of a wet process to prepare a transparent conductive film is getting popular, as described in U.S. Pat. No. 7,449,133, Japanese Patent Publication No. H01-313521, Japanese Patent Publication No. 2002-193972, Japanese Patent Publication No. 2003-286336, U.S. Pat. No. 7,378,040, Japanese Patent Publication No. 2005-281704, U.S. Pat. No. 7,060,241, U.S. Pat. No. 7,172,817 U.S. Pat. No. 7,261,852, and U.S. Pat. No. 7,459,121. These patent documents are briefly classified and illustrated as follows.

U.S. Pat. No. 7,449,133 discloses an innovative conductive material of graphene, which is modified with a molecular segment having a conductive functional group, so as to increase the number of conductive paths between graphenes, thereby improving the conductivity and the optical transmittance. However, such modification method is complicated, low yielding, and costly.

Japanese Patent Publication No. H01-313521 discloses that poly(3,4-dialkoxythiophene), which is obtained by oxidation and polymerization of 3,4-dialkoxythiophene in the presence of a polyanion, reacts with a polyanion to form a conductive polymer. Japanese Patent Publication No. 2002-193972 and Japanese Patent Publication No. 2003-286336 further disclose that higher optical transmittance and lower surface resistance (i.e., higher conductivity) can be achieved by modifying the conductive polymer, however, when the conductive polymer is used to produce a conductive thin film, the humidity and heat durability of the film is not good.

U.S. Pat. No. 7,378,040 discloses that a fluoropolymer or a fluoro-containing monomer is added to a carbon nanotube as a binder. By adding this kind of polymer or monomer, several properties such as transmittance, electrical conductivity, and mechanical strengths can be improved. However, fluoropolymer is not cost effective and will adversely affect the environment.

Japanese Patent Publication No. 2005-281704 discloses that the weather durability of a conductive polymer can be increased by adding various binders. Nevertheless, the conductivity of the conductive polymer would be decreased.

U.S. Pat. No. 7,060,241 discloses adjusting the outer diameter of a carbon nanotube to be smaller than 3.5 nm, to obtain a carbon nanotube that has high transmittance. However, it is difficult to control the outer diameter of a carbon nanotube within a certain range when the carbon nanotube is growing and being screened.

U.S. Pat. No. 7,172,817 discloses that when a conductive particle is changed from a circular shape to a flat shape, the probability of contact between the particles is increased, and the transmittance is also increased. However, the preparation of such conducive particles yields low and is costly.

U.S. Pat. No. 7,261,852 discloses that a coating containing a carbon nanotube is filtered with a filter to deposit the carbon nanotube on the filter, so that a thick carbon nanotube bulk may be deposited by the method, and a binder may also be filtered, to achieve a high electrical conductivity. However, this method may result in uneven film thickness, an unstable resistance value of a subsequent thin film, and a low visible light transmittance.

U.S. Pat. No. 7,459,121 discloses that a carbon nanotube conductive film is prepared by dip coating, and meanwhile a roll-to-roll process may be accomplished with the same coating device. However, the coating concentration in the dip coating process is extremely unstable, and a prepared thin film could not have uniform surface resistance values.

As described above, the conductive film prepared by the wet process in the prior art cannot acquire characteristics of a uniform resistance value and a high visible light transmittance simultaneously, or the preparation process is excessively complicated. Therefore, in order to solve the above-mentioned problems, the industry needs a method for preparing a conductive film, which not only satisfies requirements on various characteristics such as the electrical property, mechanical strength, and weather durability of the conductive film in the industry, but also increases the optical transmittance and simplifies the steps of the process.

SUMMARY OF THE INVENTION

Accordingly, the present invention is mainly directed to a transparent conductive film having good electrical property, mechanical strength, weather durability, and high optical transmittance.

In order to achieve the aforementioned and other objectives, the present invention provides a transparent conductive film, which includes: a substrate; a photosensitive layer comprising at least one high water contact angle region and at least one low water contact angle region on the substrate; and a conductive layer having different thicknesses on the photosensitive layer (as shown in FIG. 6).

The present invention also provides a method for preparing a transparent conductive film, which includes:
(a) providing a substrate;
(b) coating a photosensitive coating on the substrate to form a photosensitive layer;
(c) providing a mask to partially cover the photosensitive layer;
(d) irradiating the photosensitive layer with a radiation light to form at least one high water contact angle region and at least one low water contact angle region;
(e) removing the mask; and
(f) coating a conductive coating on the photosensitive layer to form a conductive layer having different thicknesses.

DETAILED DESCRIPTION OF THE INVENTION

Figure 6:
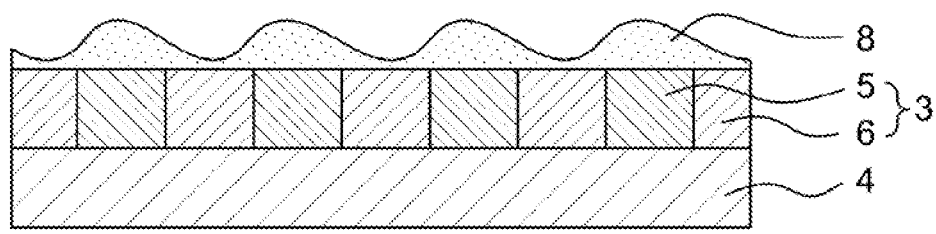
FIG. 6 illustrates a conductive layer having different thicknesses.

The present invention provides a transparent conductive film, which includes: a substrate; a photosensitive layer having at least one high water contact angle region and at least one low water contact angle region on the substrate; and a conductive layer having different thicknesses on the photosensitive layer (as shown in FIG. 6).

The substrate used in the transparent conductive film of the present invention is not particularly limited, and any conventional substrate that may serve as a substrate of the transparent conductive film is applicable to the present invention, which can be, but is not limited to, for example, polyester-based resin, acetate-based resin, polyethersulfone-based resin, polycarbonate-based resin, polyamide-based resin, polyimide-based resin, polyolefin-based resin, acrylic-based resin, polyvinyl chloride-based resin, polystyrene-based resin, polyvinyl alcohol-based resin, polyarylate-based resin, polyphenylene sulfide-based resin, polyvinylidene chloride-based resin or (methyl)acrylic-based resin.

According to a preferred implementation aspect of the present invention, the material of an applicable photosensitive coating used for forming the photosensitive layer includes: an organic compound with at least one photosensitive group, a solvent, and optionally an additive.

According to the present invention, an applicable organic compound with at least one photosensitive group may be selected from: a cinnamate, such as polyvinyl cinnamate, methyl 4-hydroxy cinnamate, or polyvinyl 4-methoxy cinnamate; coumarin (or referred to as "1,2-benzopyrone") or a derivative thereof; polyimide; and an acrylate, such as 2-hydroxyethyl methacrylate, tripropylene glycol diacrylate (TPGDA), or polyurethane acrylate.

According to the present invention, an additive applicable to the photosensitive coating can be a photo initiator, a photo sensitizer, a photoacid generator, or a combination thereof.

According to the present invention, a useful photo initiator can be, but is not limited to, 4-dimethylamino benzoic acid, 4-dimethylamino benzoate, alkoxyacetyl phenone, benzyldimethyl ketal, benzophenone, benzoyl benzoic acid alkyl ester, bi(4-dialkylaminophenyl)ketone, benzoin, benzoin benzoate, benzoin alkyl ether, 2-hydroxy-2-methylpropyl phenone, 1-hydroxycyclohexylphenone, thioxanthone, 2,4,6-trimethylbenzoyl benzoylphosphine oxide, bis(2,6)-dimethoxybenzoyl-2,4,4-trimethyl-pentylphosphine oxide, bis(2,4,6-trimethyl-benzoyl)-phenylphosphine oxide, 2-methyl-1-[4-(methylsulfanyl)phenyl]-2-morpholinyl-propane-1-one, 2-benzyl-2-dimethylamino-1-(4-morpholinylphenyl)-1-butanone, aryl cycloalkenyl metal derivatives and so on.

According to the present invention, an applicable photo sensitizer may be an azo dye containing an unsaturated double bond, such as methyl red or methyl blue.

An applicable photoacid generator may be, for example, an aryldiazonium salt, a diarylhalonium salt, or a triarylsulfonium salt.

According to a preferred implementation aspect of the present invention, after the photosensitive layer of the present invention is irradiated with a radiation light, at least one low water contact angle region and at least one high water contact angle region are formed, and a difference between the water contact angles is in a range of 5 degrees to 40 degrees, and preferably in a range of 1.0 degrees to 35 degrees.

Figure 1:
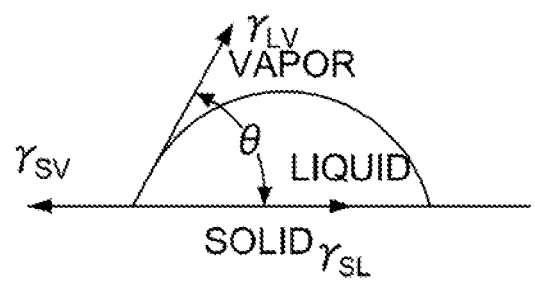
FIG. 1 is a schematic view of the Young's theorem.
Figure 4:
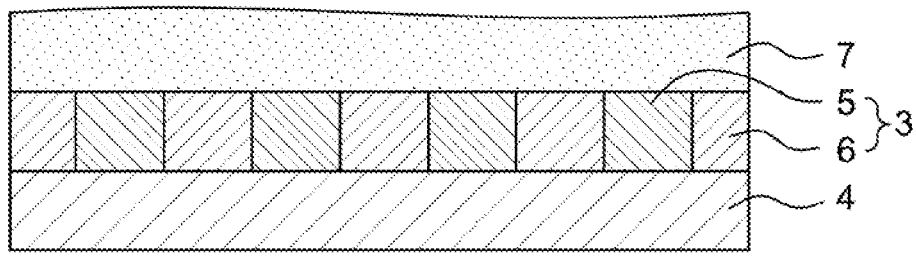
FIG. 4 illustrates a conductive coating covering a photosensitive layer.

According to a preferred implementation aspect of the present invention, the high water contact angle region of the photosensitive layer occupies 25% to 75% of a total treated area of the photosensitive layer. According to another preferred implementation aspect of the present invention, the low water contact angle region of the photosensitive layer occupies 25% to 75% of a total treated area of the photosensitive layer. A conductive coating 7 is covered on the photosensitive layer formed with different water contact angle regions (as shown in FIG. 4, the conductive coating covers the photosensitive layer). According to "the Young's theorem", when the surface of a solid is in contact with the surface of a liquid water, an angle is formed at the edge of the solid-liquid interface, and is referred to as a water contact angle (as shown in FIG. 1 which is a schematic view of the Young's theorem). A relationship between the water contact angle and the surface tension is:

$$\cos\theta = \frac{\gamma_S - \gamma_{SL}}{\gamma_L},$$

where
θ: water contact angle;
$\gamma_s$: surface tension of the solid;
$\gamma_{SL}$: surface tension of the solid-liquid interface; and
$\gamma_L$: surface tension of the liquid water.

When a liquid drop falls on a thin film formed of a substance having a low surface tension, the shape of the liquid drop tends to be circular, and the angle formed at the edge of the solid-liquid interface is large, that is, the water contact angle is large; on the contrary, when a liquid drop falls on a thin layer formed of a substance having a high surface tension, the shape of the liquid drop tends to be flat, and the angle formed at the edge of the solid-liquid interface is small, that is, the water contact angle is small. Therefore, a thin layer formed of a substance with a high surface tension has a low water contact angle; while a thin layer formed of a substance with a low surface tension has a high water contact angle.

Figure 5:
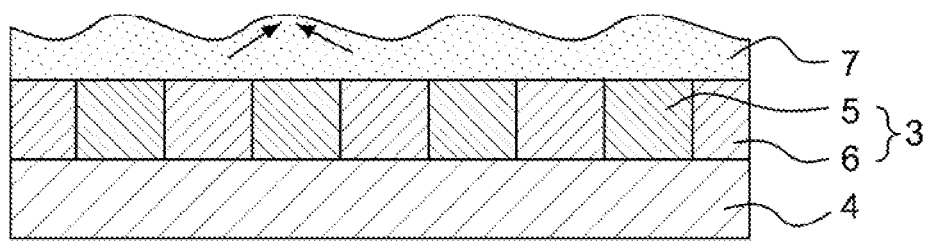
FIG. 5 is a schematic view of the flowing of the conductive coating.

It can be known from the above description that, when the conductive coating covers a Low Water Contact Angle (high surface tension) region 5 of the photosensitive layer, the shape of a coating liquid drop thereof tends to be flat, so the conductive coating easily presents a uniformly spread state. When the conductive coating covers a high water contact angle (low surface tension) region 6 of the photosensitive layer, the shape of a coating liquid drop thereof tends to be circular, so the conductive coating may not be easily uniformly spread, and has a trend of flowing to the low water contact angle region (as shown in FIG. 5 which is a schematic view of the flowing of the conductive coating).

Since the conductive coating covering the high water contact angle region has the trend of flowing to the low water contact angle region, a large amount of the conductive coating is accumulated at the low water contact angle region, and after drying, a thick conductive layer is formed at the region; on the contrary, a small amount of the conductive coating is accumulated at the high water contact angle region, and after drying, a thin conductive layer is formed at the region. In this manner, a conductive layer 8 having different thicknesses is formed (as shown in FIG. 6, a conductive layer having different thicknesses is formed).

An alpha-step instrument (Kosaka ET 4000a) may be utilized to measure an Rz (ten-point average roughness) value of the conductive layer having different thicknesses of the present invention, in which the Rz value is preferably not smaller than 20 nm, more preferably, not smaller than 25 nm, and most preferably, not smaller than 27 nm.

The conductive layer of the transparent conductive film of the present invention has different thicknesses, and the conductive material applicable to form the conductive layer may be selected from: (1) a conductive polymer; (2) a metal nanoparticle or a metal oxide nanoparticle; and (3) a nanocarbon.

A conductive polymer applicable to the present invention is a polymer having a conjugated double bond structure, such as polyaniline, polythiophene, polyacetylene, and polypyrrole.

The metal nanoparticle or the metal oxide nanoparticle applicable to the present invention may be any one well-known to persons skilled in the art, such as a silver (Ag) nanoparticle or an Indium Tin Oxide (ITO) nanoparticle.

The nanocarbon applicable to the present invention is, for example, a carbon nanotube, graphene, or a graphite nanoparticle.

The present invention also provides a method for preparing a transparent conductive film, which includes:
(a) providing a substrate;
(b) coating a photosensitive coating on the substrate to form a photosensitive layer;
(c) providing a mask to partially cover the photosensitive layer o;
(d) irradiating the photosensitive layer with a radiation light to form at least one high water contact angle region and at least one low water contact angle region;
(e) removing the mask; and
(f) coating a conductive coating on the photosensitive layer to form a conductive layer having different thicknesses.

According to a specific implementation aspect of the present invention, in the method for preparing the transparent conductive film, the photosensitive coating is coated on the substrate to form the photosensitive layer. Then the mask is covered on or above or under the photosensitive layer, and the radiation light (such as an ultraviolet light) is irradiated photosensitive layer through the mask to form one or more low water contact angle regions (high surface tension) and one or more high water contact angle regions (low surface tension). Then, the mask is removed, and the conductive coating is coated on the photosensitive layer. The conductive coating coated thereon is easily accumulated at the low water contact angle region, and a thick conductive layer is formed at the region; while the conductive coating coated thereon may not be easily accumulated at the high water contact angle region, and a thin conductive layer is formed at the region. In this manner, a conductive layer having different thicknesses is formed.

The photosensitive coating according to the present invention may be cured through irradiation of a light or heating, and after curing, due to variation of a functional group, variation of a structure, and variation of a cohesive force, the surface tension apparently changes.

Figure 2:
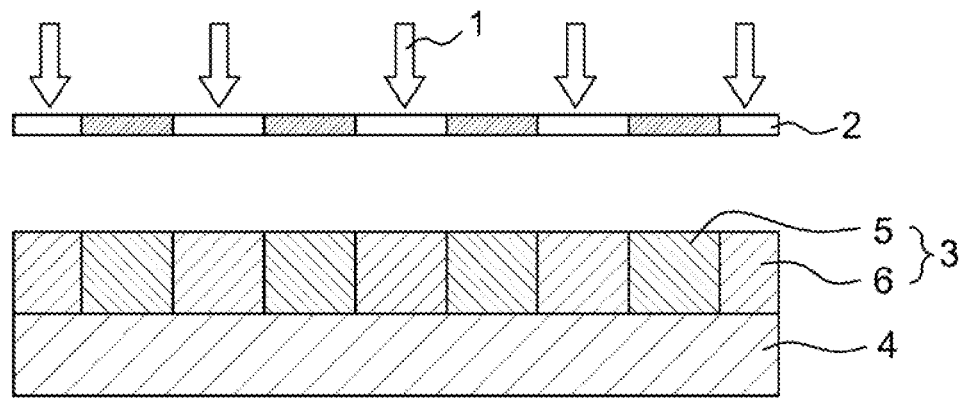
FIG. 2 is a schematic view of a mask exposure process.
Figure 3:
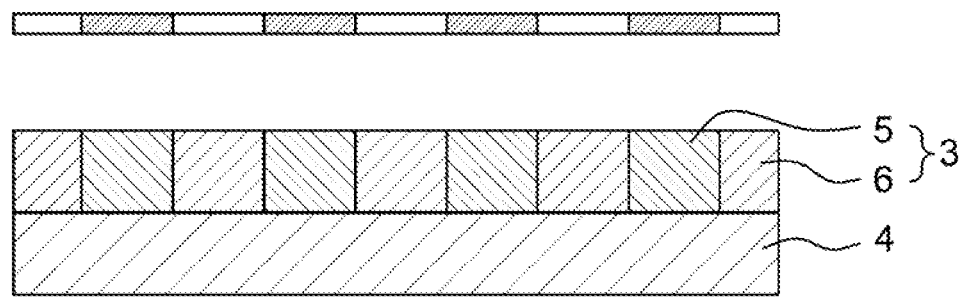
FIG. 3 illustrates a photosensitive layer having different water contact angle regions.

According to a preferred embodiment of the present invention, as shown in FIG. 2, a photosensitive coating is coated on a substrate 4 to form a photosensitive layer 3, a mask 2 is covered over the photosensitive layer 3, an ultraviolet light 1 is irradiated, and for a region irradiated with the ultraviolet light, a water contact angle of photosensitive layer changes; while for a region covered by a pattern of the mask and not irradiated with the ultraviolet light, a water contact angle of photosensitive layer maintains unchanged. Hence, as shown in FIG. 3, the regions having different water contact angles (the low water contact angle region 5 and the high water contact angle region 6) are formed.

According to the present invention, by selecting different organic compound in the photosensitive layer as described above, the water contact angle of the photosensitive layer changes to different extents.

The photosensitive layer of the transparent conductive film of the present invention has at least one high water contact angle region and at least one low water contact angle region, and a difference between the high water contact angle region and the low water contact angle region is in a range of 5 degrees to 40 degrees, and preferably in a range of 10 degrees to 35 degrees.

According to the present invention, by selecting masks with different coverage rates, a ratio of the region area of the low water contact angle region to that of the high water contact angle region may be regulated. According to a specific embodiment of the present invention, a coverage rate of the mask is in a range of 25% to 75%.

The conductive coating 7 formed of a solvent and a conductive material is coated on the photosensitive layer formed with different water contact angle regions (as shown in FIG. 4, the conductive coating is deposited on the photosensitive layer). For the conductive coating deposited on the low water contact angle (high surface tension) region 5, the shape of a coating liquid drop thereof tends to be flat, so the conductive coating easily presents a uniformly spread state. For the conductive coating deposited on the high water contact angle (low surface tension) region 6, the shape of a coating liquid drop thereof tends to be circular, so the conductive coating may not be easily uniformly spread, and has a trend of flowing to the low water contact angle region (as shown in FIG. 5 which is a schematic view of the flowing of the conductive coating).

Since the conductive coating deposited on the high water contact angle region has the trend of flowing to the low water contact angle region, a large amount of the conductive coating is accumulated at the low water contact angle region, and after drying, a thick conductive layer is formed at the region; on the contrary, a small amount of the conductive coating is accumulated at the high water contact angle region, and after drying, a thin conductive layer is formed at the region. In this manner, a conductive layer 8 having different thicknesses is formed (as shown in FIG. 6, a conductive layer having different thicknesses is formed).

According to the method of the present invention, by adjusting an irradiation dosage of the ultraviolet light, the water contact angle of the photosensitive layer changes to different extents. When the photosensitive layer is irradiated with the ultraviolet light, as the irradiation dosage of the ultraviolet light is increased, the difference between the water contact angles of the low water contact angle region and the high water contact angle region becomes larger. According to the present invention, the irradiation dosage of the ultraviolet light is preferably in a range of 100 ml/cm$^2$ to 800 mJ/cm$^2$.

Therefore, in a method for adjusting the irradiation dosage of the ultraviolet light, the difference between the water contact angles of the low water contact angle region and the high water contact angle region may be increased, thereby influencing the accumulation extent of the conductive coating, so that the thickness difference of the conductive layer is increased, and the improvement of the optical transmittance becomes more apparent.

According to the present invention, by forming two or more different water contact angle regions, a technology of forming a conductive layer having different thicknesses is developed and can be applied to a conductive coating prepared by various conductive materials.

According to the present invention, water may be used as a solvent to disperse the conductive material, so as to formulate the conductive coating. An organic solvent such as alcohol, ketone, or ester may also be used to disperse the conductive material, so as to formulate the conductive coating. No matter whether the water or the organic solvent is used to formulate the conductive coating, as long as the surface tension of the conductive coating is controlled between 15 dyne/cm and 40 dyne/cm, and the conductive coating is coated on the photosensitive layer having different water contact angle regions, a conductive layer having different thicknesses may be formed.

In the method for preparing the transparent conductive film according to the present invention, the operation process is simple, and the coating concentration can be fixed during the preparation process, so as to precisely control the thickness of each layer, and obtain a thin film having a stable resistance value and high optical transmittance.

EXAMPLES

The following examples are provided to further illustrate the present invention, instead of limiting the scope of the present invention. Any modification or variation made by persons skilled in the art without departing from the spirit of the present invention shall fall within the scope of the present invention.

A: Control the Difference Between the Water Contact Angles of the High Water Contact Angle Region and the Low Water Contact Angle Region on the Photosensitive Layer Example 1

Firstly, a photosensitive material (organic compound with at least one photosensitive functional group) is formulated into a photosensitive coating, and is coated on a substrate to form a photosensitive layer, which includes the following steps:

(1.1) 3.5 g of a mixed solvent is formulated with methylethylketone and cyclopentanone in a weight ratio of 1:1.

(1.2) 0.5 g of a photosensitive material (Switzerland Rolic, model Rop-1.03, cinnamate, in which the solid content is 10%, and the solvent is cyclopentanone) is added to 3.5 g of the mixed solvent formulated in Step (1.1), and is diluted into 4 g of a photosensitive coating having a solid content of 1.25%.

(1.3) 4 g of the photosensitive coating formulated in Step (1.2) is dropped on a polyester substrate (Japan Toyobo, model A4300, 5 cm×5 cm×100 μm), the coating is uniformly spread with spin coating (1000 rpm, 40 seconds), and then the polyester substrate is placed in an oven at a constant temperature of 100° C., baked for 2 minutes to remove the solvent, and finally restored to the room temperature, so as to form the photosensitive layer on the substrate.

Figure 7:
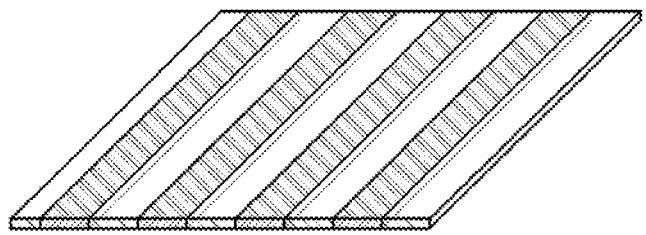
FIG. 7 is a schematic view of a mask with a coverage rate of 50%.

Then, the photo sensitive layer is partially covered by a mask, which is irradiated with an ultraviolet light, so that the photosensitive layer generates different water contact angle regions, which includes the following steps:

(1.4) A mask with a coverage rate of 50% (as shown in FIG. 7) is placed on the substrate manufactured through Step (1.3) and coated with the photosensitive layer.

(1.5) The arrangement obtained from step (1.4) (as shown in FIG. 2) was irradiated with ultraviolet light with an irradiation dosage of 470 (mJ/cm$^2$) by using an ultraviolet exposure machine (USA Fusion) (as shown in FIG. 2), and the mask is removed after the irradiation. For a region of the photosensitive layer irradiated with the ultraviolet light, the water contact angle of the photosensitive layer changes; while for a region covered by a pattern of the mask and not irradiated with the ultraviolet light, the water contact angle of the photosensitive layer maintains unchanged, so that two different water contact angle regions (as shown in FIG. 3) are formed, and a measured difference between the water contact angles is 5 degrees.

A conductive coating is coated on the photosensitive layer to form a conductive layer, which includes the following steps:

(1.6) The photosensitive layer manufactured in Step (1.5) and formed with two different water contact angle regions is placed on a platform. A conductive polymer solution at a conduction level (purchased from Germany HC. Starck) is used as the conductive coating, 3 ml of which is taken to drop on the photosensitive layer.

(1.7) A coating rod (Rod No. 9, used to coat a wet film having the thickness of 20.6 μm) is placed on the photosensitive layer, and after the conductive coating totally wets the coating rod, the conductive coating is completely spread on the photosensitive layer in a sliding manner, so as to form a wet film having the thickness of about 20 μm (as shown in FIG. 4).

(1.8) The wet film formed by coating in Step (1.7) is put in an oven at a constant temperature of 100° C., and baked for 2 minutes to remove the solvent, so as to deposit a conductive layer on the photosensitive layer.

Example 2

A preparation process includes the following steps:

(2.1) 3.2 g of toluene and 0.04 g of a photo initiator (USA Ciba, I-184) are added to 0.76 g of a photosensitive material (Cognis, model 4172F, acrylate) to formulate 4 g of a photosensitive coating having a solid content of 20%.

(2.2) 4 g of the photosensitive coating formulated in Step (2.1) is dropped on a polyester substrate (Japan Toyobo, model A4300. 5 cm×5 cm×100 μm), the coating is uniformly spread with spin coating (1000 rpm, 40 seconds), and then the polyester substrate is placed in an oven at a constant temperature of 1.00° C., baked for 2 minutes to remove the solvent, and finally restored to the room temperature, so as to form the photosensitive layer on the substrate.

(2.3) A mask with a coverage rate of 50% is placed on the photosensitive layer manufactured through Step (2.2).

(2.4) By using an ultraviolet exposure machine (USA Fusion), the photosensitive layer is partially irradiated with an ultraviolet light having an irradiation dosage of 470 (mJ/cm$^2$).

(2.5) The mask is removed from the photosensitive layer, and the photosensitive layer is placed in a transparent box filled with nitrogen gas. By using an ultraviolet light exposure machine, the photosensitive layer placed in the transparent box is irradiated with an ultraviolet light and is completely dried, in which the irradiation dosage of the ultraviolet light is 470 (mJ/cm$^2$). In this manner, two different water contact angle regions are formed, and a measured difference between the water contact angles is 15 degrees.

Steps (2.6) to (2.8) are the same as Steps (1.6) to (1.8).

Example 3

A preparation process includes the following steps:

(3.1) 3.2 g of toluene and 0.04 g of a photo initiator (USA Ciba, 1-184) are added to 0.76 g of a photosensitive material (USA Sartomer, model SR-285, acrylate) to formulate 4 g of a photosensitive coating having a solid content of 20%.

(3.2) 4 g of the photosensitive coating formulated in Step (3.1) is dropped on a polyester substrate (Japan Toyobo, model A4300. 5 cm×5 cm×100 μm), the coating is uniformly spread with spin coating (1000 rpm, 40 seconds), and then the polyester substrate is placed in an oven at a constant temperature of 100° C., baked for 2 minutes to remove the solvent, and finally restored to the room temperature, so as to form the photosensitive layer on the substrate.

(3.3) A mask with a coverage rate of 50% is placed on the photosensitive layer manufactured through Step (3.2).

(3.4) By using an ultraviolet exposure machine (USA Fusion), the photosensitive layer is partially irradiated with an ultraviolet light having an irradiation dosage of 470 (mJ/cm$^2$).

(3.5) The mask is removed from the photosensitive layer, and the photosensitive layer is placed in a transparent box filled with nitrogen gas. By using an ultraviolet light exposure machine, the photosensitive layer placed in the transparent box is irradiated with an ultraviolet light, and the irradiation dosage of the ultraviolet light is 470 (mJ/cm$^2$). In this manner, two different water contact angle regions are formed, and a difference between the water contact angles is 35 degrees.

Steps (3.6) to (3.8) are the same as Steps (1.6) to (1.8).

B: Different Mask Coverage Rates

Example 4

A preparation process includes the following steps:
Step (4.1) is the same as Step (3.1).
Step (4.2) is the same as Step (3.2).

Figure 10:
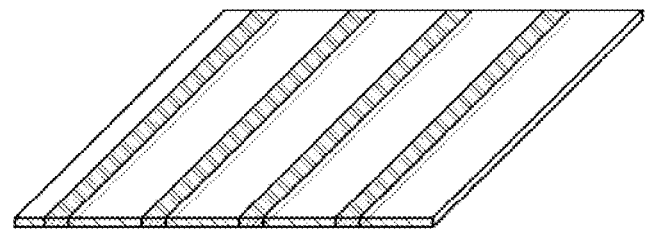
FIG. 10 is a schematic view of a mask with a coverage rate of 25%.

(4.3) A mask with a coverage rate of 25% (as shown in FIG. 10) is placed on the photosensitive layer manufactured through Step (4.2).

(4.4) By using an ultraviolet exposure machine (USA Fusion), the photosensitive layer is partially irradiated with an ultraviolet light having an irradiation dosage of 470 (mJ/cm$^2$).

(4.5) The mask is removed from the photosensitive layer, and the photosensitive layer is placed in a transparent box filled with nitrogen gas. By using an ultraviolet light exposure machine, the photosensitive layer placed in the transparent box is irradiated with an ultraviolet light and is dried, and the irradiation dosage of the ultraviolet light is 470 (mJ/cm$^2$). In this manner, two different water contact angle regions are formed, and a difference between the water contact angles is 35 degrees.

Steps (4.6) to (4.8) are the same as Steps (1.6) to (1.8).

Example 5

A preparation process includes the following steps:
Step (5.1) is the same as Step (3.1).
Step (5.2) is the same as Step (3.2).

Figure 8:
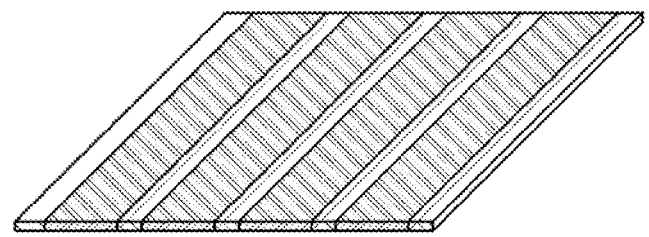
FIG. 8 is a schematic view of a mask with a coverage rate of 75%.

(5.3) A mask with a coverage rate of 75% (as shown in FIG. 8) is placed on the photosensitive layer manufactured through Step (5.2).

(5.4) By using an ultraviolet exposure machine (USA Fusion), the photosensitive layer is partially irradiated with an ultraviolet light having an irradiation dosage of 470 (mJ/cm$^2$).

(5.5) The mask is removed from the photosensitive layer, and photosensitive layer is placed in a transparent box filled with nitrogen gas. By using an ultraviolet light exposure machine, the photosensitive layer placed in the transparent box is irradiated with an ultraviolet light and is dried, and the irradiation dosage of the ultraviolet light is 470 (mJ/cm$^2$). In this manner, two different water contact angle regions are formed, and a difference between the water contact angles is 35 degrees.

Steps (5.6) to (5.8) are the same as Steps (1.6) to (1.8).

C: Different Conductive Materials

Example 6

A preparation process includes the following steps:
Steps (6.1) to (6.5) are the same as Steps (3.1) to (3.5).

(6.6) The photosensitive layer manufactured in Step (6.5) and formed with two different water contact angle regions is placed on a platform. A carbon nanotube dispersion at a conduction level (purchased from USA XinNano) is used as the conductive coating, 3 ml of which is taken to drop on the photosensitive layer.

(6.7) A coating rod (Rod No. 9, used to coat a wet film having the thickness of 20.6 μm) is placed on the photosensitive layer, and after the conductive coating completely wets the coating rod, the conductive coating is completely spread on the photosensitive layer in a sliding manner, so as to form a wet film having the thickness of about 20 μm.

(6.8) The wet film formed by coating in Step (6.7) is put in an oven at a constant temperature of 100° C., and baked for 2 minutes to remove the solvent, so as to deposit a conductive layer on the photosensitive layer.

Example 7

A preparation process includes the following steps:

Steps (7.1) to (7.5) are the same as Steps (3.1) to (3.5).

(7.6) The photosensitive layer manufactured in Step (7.5) and formed with two different water contact angle regions is placed on a platform. A graphene dispersion at a conduction level (purchased from USA XG SCIENCES) is used as the conductive coating, 3 ml of which is taken to drop on the photosensitive layer.

(7.7) A coating rod (Rod No. 9, used to coat a wet film having the thickness of 20.6 µm) is placed on the photosensitive layer, and after the conductive coating completely wets the coating rod, the conductive coating is completely spread on the photosensitive layer in a sliding manner, so as to form a wet film having the thickness of about 20 µm.

(7.8) The wet film formed by coating in Step (7.7) is put in an oven at a constant temperature of 100° C., and baked for 2 minutes to remove the solvent, so as to deposit a conductive layer on the photosensitive layer.

Example 8

A preparation process includes the following steps:

Steps (8.1) to (8.5) are the same as Steps (3.1) to (3.5).

(8.6) The photosensitive layer manufactured in Step (8.5) and formed with two different water contact angle regions is placed on a platform. An Ag nano particle dispersion at a conduction level (purchased from Cima) is used as the conductive coating, 3 ml of which is taken to drop on the photosensitive layer.

(8.7) A coating rod (Rod No. 9, used to coat a wet film having the thickness of 20.6 µm) is placed on the photosensitive layer, and after the conductive coating completely wets the coating rod, the conductive coating is completely spread on the photosensitive layer in a sliding manner, so as to form a wet film having the thickness of about 20 µm.

(8.8) The wet film formed by coating in Step (8.7) is put in an oven at a constant temperature of 100° C., and baked for 2 minutes to remove the solvent, so as to deposit a conductive layer on the photosensitive layer.

Comparative Example

A: Control the Difference Between the Water Contact Angles of the High Water Contact Angle Region and the Low Water Contact Angle Region on the Photosensitive Layer

Comparative Example 1

Steps (1.1) to (1.4) are the same as Steps (1.1) to (1.4) in Example 1.

(1.5) The arrangement obtained from step (1.4) was irradiated with an ultraviolet light having an irradiation dosage of 100 (mJ/cm$^2$) by using an ultraviolet exposure machine (USA Fusion), and the mask is removed after the irradiation. For a region of the photosensitive layer irradiated with the ultraviolet light, a water contact angle changes; while for a region covered by a pattern on the mask and not irradiated with the ultraviolet light, the water contact angle of the photo sensitive layer maintains unchanged, so that two different water contact angle regions are formed, and a measured difference between the water contact angles is 2 degrees.

Steps (1.6) to (1.8) are the same as Steps (1.6) to (1.8) in Example 1.

Comparative Example 2

A preparation process includes the following steps:

(2.1) A polyester substrate (Japan Toyobo, model A4300, 5 cm×5 cm×100 µm) is taken.

(2.2) A conductive polymer solution at a conduction level (purchased from Germany HC. Starck) is used as the conductive coating, 3 ml of which is taken to drop on the substrate.

(2.3) A coating rod (Rod No. 9, used to coat a wet film having the thickness of 20.6 µm) is placed on the substrate, and after the conductive coating completely wets the coating rod, the conductive coating is completely spread on the substrate in a sliding manner, so as to form a wet film having the thickness of about 20 µm.

(2.4) The wet film formed by coating in Step (2.3) is put in an oven at a constant temperature of 100° C., and baked for 2 minutes to remove the solvent, so as to deposit a conductive layer on the substrate.

Comparative Example 3

A preparation process includes the following steps:

Step (3.1) is the same as Step (3.1) in Example 3.

Step (3.2) is the same as Step (3.2) in Example 3.

(3.3) A mask with a coverage rate of 50% is placed on the substrate manufactured through Step (3.2) and coated with the photosensitive layer.

(3.4) By using an ultraviolet exposure machine (USA Fusion), which placed over the mask irradiates with an ultraviolet light having an irradiation dosage of 800 (mJ/cm$^2$), so that two different water contact angle regions are formed, and a difference between the water contact angles is 50 degrees.

Steps (3.5) to (3.7) are the same as Steps (1.6) to (1.8) in Example 1.

B: Different Mask Coverage Rates

Comparative Example 4

A preparation process includes the following steps:

Step (4.1) is the same as Step (3.1) in Example 3.

Step (4.2) is the same as Step (3.2) in Example 3.

Figure 11:
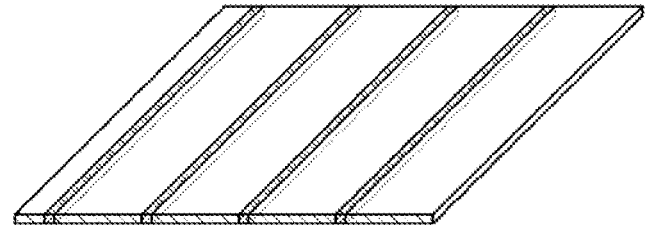
FIG. 11 is a schematic view of a mask with a coverage rate of 10%.

(4.3) A mask with a coverage rate of 10% (as shown in FIG. 11) is placed on the photosensitive layer manufactured through Step (4.2).

(4.4) By using an ultraviolet exposure machine (USA Fusion), which placed over the mask irradiates with an ultraviolet light having an irradiation dosage of 470 (mJ/cm$^2$).

(4.5) The mask is removed from the photosensitive layer, and the photosensitive layer is placed in a transparent box filled with nitrogen gas. By using an ultraviolet light exposure machine, the photosensitive layer placed in the transparent box is irradiated with an ultraviolet light and is dried, and the irradiation dosage of the ultraviolet light is 470 (mJ/cm$^2$). In this manner, two different water contact angle regions are formed, and a difference between the water contact angles is 35 degrees.

Steps (4.6) to (4.8) are the same as Steps (1.6) to (1.8) in Example 1.

Comparative Example 5

A preparation process includes the following steps:

Step (5.1) is the same as Step (3.1) in Example 3.

Step (5.2) is the same as Step (3.2) in Example 3.

Figure 9:
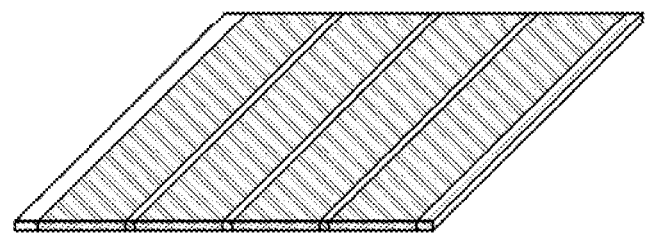
FIG. 9 is a schematic view of a mask with a coverage rate of 90%.

(5.3) A mask with a coverage rate of 90% (as shown in FIG. 9) is placed on the photosensitive layer manufactured through Step (5.2).

(5.4) By using an ultraviolet exposure machine (USA Fusion), which placed over the mask irradiates with an ultraviolet light having an irradiation dosage of 470 (mJ/cm$^2$).

(5.5) The mask is removed from the photosensitive layer, and the photosensitive layer is placed in a transparent box filled with nitrogen gas. By using an ultraviolet light exposure machine, the photosensitive layer placed in the transparent box is irradiated with an ultraviolet light and is dried, and the irradiation dosage of the ultraviolet light is 470 (mJ/cm$^2$). In this manner, two different water contact angle regions are formed, and a difference between the water contact angles is 35 degrees.

Steps (5.6) to (5.8) are the same as Steps (1.6) to (1.8) in Example 1.

C: Different Conductive Materials

Comparative Example 6

A preparation process includes the following steps:

(6.1) A polyester substrate (Japan Toyobo, model A4300, 5 cm×5 cm×100 μm) is taken.

(6.2) A carbon nanotube dispersion at a conduction level (purchased from USA XinNano) is used as the conductive coating, 3 ml of which is taken to drop on the substrate.

(6.3) A coating rod (Rod No. 9, used to coat a wet film having the thickness of 20.6 μm) is placed on the substrate, and after the conductive coating completely wets the coating rod, the conductive coating is completely spread on the substrate in a sliding manner, so as to form a wet film having the thickness of about 20 μm.

(6.4) The wet film formed by coating in Step (6.31) is put in an oven at a constant temperature of 100° C., and baked for 2 minutes to remove the solvent, so as to deposit a conductive layer on the substrate.

Comparative Example 7

A preparation process includes the following steps:

(7.1) A polyester substrate (Japan Toyobo, model A4300, 5 cm×5 cm×100 μm) is taken.

(7.2) A graphene dispersion at a conduction level (purchased from USA XC SCIENCES) is used as the conductive coating, 3 ml of which is taken to drop on the substrate.

(7.3) A coating rod (Rod No. 9, used to coat a wet film having the thickness of 20.6 μm) is placed on the substrate, and after the conductive coating completely wets the coating rod, the conductive coating is completely spread on the substrate in a sliding manner, so as to form a wet film having the thickness of about 20 μm.

(7.4) The wet film formed by coating in Step (7.3) is put in an oven at a constant temperature of 100° C., and baked for 2 minutes to remove the solvent, so as to deposit a conductive layer on the substrate.

Comparative Example 8

A preparation process includes the following steps:

(8.1) A polyester substrate (Japan Toyobo, model A4300, 5 cm×5 cm×100 μm) is taken.

(8.2) A Ag nanoparticle dispersion at a conduction level (purchased from Cima) is used as the conductive coating, 3 ml of which is taken to drop on the substrate.

(8.3) A coating rod (Rod No. 9, used to coat a wet film having the thickness of 20.6 μm) is placed on the substrate, and after the conductive coating completely wets the coating rod, the conductive coating is completely spread on the substrate in a sliding manner, so as to form a wet film having the thickness of about 20 μm.

(8.4) The wet film formed by coating in Step (8.3) is put in an oven at a constant temperature of 100° C., and baked for 2 minutes to remove the solvent, so as to deposit a conductive layer on the substrate.

Sample Test Method for the Examples and the Comparative Examples

<Probe Type Surface Analyzer Test>

The samples of the examples and the comparative examples are tested with a probe type surface analyzer (manufactured by Japan KOSAKA, model ET-4000A), so as to measure Rz values (thickness differences between a thick region and a thin region in a conductive layer) of the examples and the comparative examples.

<Surface Resistivity Test>

The samples of the examples and the comparative examples are tested with a high current impedance meter (manufactured by Japan Mitsubishi Chemical Corporation, model MCP-HT450, probe model URS) according to ASTM D257-93, so as to measure surface resistance values of the examples and the comparative examples.

<Optical Transmittance Test>

Taking JIS-K7105 as a basis, the samples of the examples and the comparative examples are tested with a haze meter (manufactured by Nippon Denshoku Industries, model NDH-2000), so as to measure optical transmittances of the samples of the examples and the comparative examples.

Experiment Data

A: Control the Difference Between the Water Contact Angles of the High Water Contact Angle Region and the Low Water Contact Angle Region on the Photosensitive Layer

TABLE 1

|  | Example 1 | Example 2 | Example 3 |
|---|---|---|---|
| Photosensitive coating formula | methylethylketone 1.75 g cyclopentanone 1.75 g Rop-103 0.5 g | toluene 3.2 g I-184 0.04 g 4172F 0.76 g | toluene 3.2 g I-184 0.04 g SR-285 0.76 g |
| Irradiation dosage | 470 mJ/cm$^2$ | 470 mJ/cm$^2$ | 470 mJ/cm$^2$ |
| Difference between the water contact angles | 5 degrees | 15 degrees | 35 degrees |

TABLE 1-continued

|  | Example 1 | Example 2 | Example 3 |
|---|---|---|---|
| Mask coverage rate (%) | 50 | 50 | 50 |
| Thickness difference of the conductive layer $R_z$ (nm) | 32 nm | 85 nm | 127 nm |
| Optical transmittance (%) | 85.2 | 87.8 | 90.4 |
| Surface resistance (Ω/) | 800 | 800 | 800 |

TABLE 2

|  | Comparative example 1 | Comparative example 2 | Comparative example 3 |
|---|---|---|---|
| Photosensitive coating formula | methylethylketone 1.75 g cyclopentanone 1.75 g Rop-103 0.5 g | None | toluene 3.2 g I-184 0.04 g SR-285 0.76 g |
| Irradiation dosage | 100 mJ/cm² | None | 800 mJ/cm² |
| Difference between the water contact angles | 2 degrees | 0 degrees | 50 degrees |
| Mask coverage rate (%) | 50 | 50 | 50 |
| Thickness difference of the conductive layer $R_z$ (nm) | <5 nm | <5 nm | The film cannot be formed. |
| Optical transmittance (%) | 83.1 | 82.9 |  |
| Surface resistance (Ω/) | 800 | 800 |  |

According to the data in Tables 1 and 2, the photosensitive coating formula or the ultraviolet irradiation dosage may influence the difference between different water contact angle regions of the photosensitive layer and the thickness difference of the conductive layer of the transparent conductive film.

It can be seen from Comparative example 1 and Examples 0.1 to 3 that, with the increase of the difference between the water contact angles of the high water contact angle region and the low water contact angle region, when the conductive coating is coated thereon, the tendency of the conductive coating accumulated at the low water contact angle region becomes stronger, so that a larger amount of the conductive coating is accumulated at the low water contact angle region, and a thicker conductive layer is formed after drying; on the contrary, a smaller amount of the conductive coating is accumulated at the high water contact angle region, and after drying, a thinner conductive layer is formed. Hence, the thickness difference between the thick region and the thin region in the conductive layer is increased, thereby the improvement of the optical transmittance is getting more apparent.

In the industry, generally for the transparent conductive film, the increase of the optical transmittance is required to be more than 2%. In contrast with Comparative example 2, the increase of the optical transmittance in Comparative example 1 is less than 1%, which is not apparent; while the increase of the optical transmittances in Examples 1 to 3 is more than 2%, which is apparent, and the original conductivity can still be maintained, thus conforming to the demands of the industry.

However, according to the data in Comparative example 3, when the difference between the water contact angles exceeds 50 degrees, the conductive coating is completely accumulated at the low water contact angle region, while no conductive coating exists on the high water contact angle region; at this time, a complete layer cannot be formed, and many defects on a him surface are generated, so that the difference between the water contact angles of the high water contact angle region and the low water contact angle region should be controlled below 50 degrees.

B: Different Mask Coverage Rates

TABLE 3

|  | Example 3 | Example 4 | Example 5 |
|---|---|---|---|
| Photosensitive coating formula | toluene 3.2 g I-184 0.04 g SR-285 0.76 g | toluene 3.2 g I-184 0.04 g SR-285 0.76 g | toluene 3.2 g I-184 0.04 g SR-285 0.76 g |
| Irradiation dosage | 470 mJ/cm² | 470 mJ/cm² | 470 mJ/cm² |
| Difference between the water contact angles | 35 degrees | 35 degrees | 35 degrees |
| Mask coverage rate (%) | 50 | 25 | 75 |
| Thickness difference of the conductive layer $R_z$ (nm) | 127 nm | 130 nm | 128 nm |
| Optical transmittance (%) | 90.4 | 90.6 | 86.5 |
| Surface resistance (Ω/) | 800 | 830 | 800 |

TABLE 4

|  | Comparative example 4 | Comparative example 5 |
|---|---|---|
| Photosensitive coating formula | toluene 3.2 g I-184 0.04 g SR-285 0.76 g | toluene 3.2 g I-1.84 0.04 g SR-285 0.76 g |
| Irradiation dosage | 470 mJ/cm² | 470 mJ/cm² |
| Difference between the water contact angles | 35 degrees | 35 degrees |
| Mask coverage rate (%) | 10 | 90 |
| Thickness difference of the conductive layer $R_z$ (nm) | 125 nm | 131 nm |

TABLE 4-continued

|  | Comparative example 4 | Comparative example 5 |
|---|---|---|
| Optical transmittance (%) | 90.7 | 83.6 |
| Surface resistance (Ω/) | 1000 | 800 |

It can be seen from the data of Examples 3 to 5 and Comparative examples 4 to 5 in Tables 3 and 4, in addition to changing the optical transmittance, the change of the mask coverage rate also causes change of the surface resistance. Under the same condition, with the decrease of the mask coverage rate, the area of the thin region of the conductive layer becomes larger, and the optical transmittance and the surface resistance are both increased.

However, in the industry, generally for the transparent conductive film, the increase of the surface resistance is required not to exceed 10%. The surface resistance in Example 4 (the mask coverage rate of 25%) is 830 and is not increased by more than 10%, which therefore conforms to the requirement; while the surface resistance in Comparative example 4 (the mask coverage rate of 10%) is 1000, and is increased by more than 10%, which seriously influences the conductivity of the conductive layer and therefore does not conform to the requirement.

C: Different Conductive Materials

TABLE 5

|  | Example 6 | Comparative example 6 |
|---|---|---|
| Photosensitive coating formula | toluene 3.2 g<br>I-184 0.04 g<br>SR-285 0.76 g | None |
| Irradiation dosage | 470 mJ/cm$^2$ | None |
| Difference between the water contact angles | 35 degrees | 0 degrees |
| Mask coverage rate (%) | 50 | 50 |
| Material type of the conductive layer | carbon nanotube | carbon nanotube |
| Thickness difference of the conductive film $R_z$ (nm) | 45 nm | <5 nm |
| Optical transmittance (%) | 90.6 | 84.1 |
| Surface resistance (Ω/) | 900 | 900 |

TABLE 6

|  | Example 7 | Comparative example 7 |
|---|---|---|
| Photosensitive coating formula | toluene 3.2 g<br>I-184 0.04 g<br>SR-285 0.76 g | None |
| Irradiation dosage | 470 mJ/cm$^2$ | None |
| Difference between the water contact angles | 35 degrees | 0 degrees |
| Mask coverage rate (%) | 50 | 50 |
| Material type of the conductive layer | graphene | graphene |
| Thickness difference of the conductive layer $R_z$ (nm) | 27 nm | <5 nm |
| Optical transmittance (%) | 81.3 | 76.0 |
| Surface resistance (Ω/) | 1100 | 1100 |

TABLE 7

|  | Example 8 | Comparative example 8 |
|---|---|---|
| Photosensitive coating formula | toluene 3.2 g<br>I-184 0.04 g<br>SR-285 0.76 g | No |
| Irradiation dosage | 470 mJ/cm$^2$ | No |
| Difference between the water contact angles | 35 degrees | 0 degrees |
| Mask coverage rate (%) | 50 | 50 |
| Material type of the conductive layer | Ag nanoparticle | Ag nanoparticle |
| Thickness difference of the conductive film $R_z$ (nm) | 1.15 nm | <5 nm |
| Optical transmittance (%) | 85.1 | 80.2 |
| Surface resistance (Ω/) | 150 | 150 |

It can be seen from each data in Tables 5 to 7, the transparent conductive film prepared with the method of the present invention has a preferable optical transmittance, and also maintains the surface resistance. However, in contrast with the data in Examples 6 to 8, it can be seen that if a different conductive material is used, the optical transmission rate and the surface resistance of the transparent conductive film may also change.

In view of the data comparison among the foregoing examples and comparative examples, it may be known that, the transparent conductive film of the present invention has a preferable optical transmission rate while maintaining the conductive characteristics.

We claim:

1. A method for preparing a transparent conductive film, comprising:
    (a) providing a substrate;
    (b)-coating a photosensitive coating on the substrate to form a photosensitive layer;
    (c) providing a mask to partially cover the photosensitive layer;
    (d) irradiating the photosensitive layer with a radiation light to form at least one high water contact angle region and at least one low water contact angle region;
    (e) removing the mask; and
    (f) coating a conductive coating on the photosensitive layer to form a conductive layer having different thicknesses,
    wherein the photosensitive coating comprises an organic compound with at least one photosensitive functional group, a solvent, and optionally an additive,
    wherein the organic compound is selected from the group consisting of a cinnamate, an acrylate, and a mixture thereof,
    wherein the cinnamate is selected from the group consisting of polyvinyl cinnamate, methyl 4-hydroxy cinnamate, polyvinyl 4-methoxy cinnamate, and a mixture thereof, and
    wherein the acrylate is selected from the group consisting of 2-hydroxyethyl methacrylate, tripropylene glycol diacrylate, polyurethane acrylate, and a mixture thereof.

2. The method according to claim 1, wherein the difference between the high water contact angle and the low water contact angle is between 5 degrees and 40 degrees.

3. The method according to claim 1, wherein the mask covers 25% to 75% of the photosensitive layer.

4. The method according to claim 1, wherein the conductive coating has a surface tension of between 15 dyne/cm and 40 dyne/cm.

5. The method according to claim 1, wherein the radiation light is an ultraviolet light.

6. The method according to claim 1, wherein a dosage of the irradiation light is in the range of 100 mJ/cm$^2$ to 800 mJ/cm$^2$ during irradiating the photosensitive layer in step (d).

7. The method according to claim 1, wherein the additive is a photo initiator, a photo sensitizer, a photoacid generator, or a combination thereof.

8. A method for preparing a transparent conductive film, comprising:
   (a) providing a substrate;
   (b)-coating a photosensitive coating on the substrate to form a photosensitive layer;
   (c) providing a mask to partially cover the photosensitive layer;
   (d) irradiating the photosensitive layer with a radiation light to form at least one high water contact angle region and at least one low water contact angle region;
   (e) removing the mask; and
   (f) coating a conductive coating on the photosensitive layer to form a conductive layer having different thicknesses,
   wherein the photosensitive coating comprises an organic compound with at least one photosensitive functional group, a solvent, and optionally an additive, and the organic compound is a cinnamate is selected from the group consisting of polyvinyl cinnamate, methyl 4-hydroxy cinnamate, polyvinyl 4-methoxy cinnamate, and a mixture thereof.

9. A method for preparing a transparent conductive film, comprising:
   (a) providing a substrate;
   (b)-coating a photosensitive coating on the substrate to form a photosensitive layer;
   (c) providing a mask to partially cover the photosensitive layer;
   (d) irradiating the photosensitive layer with a radiation light to form at least one high water contact angle region and at least one low water contact angle region:
   (e) removing the mask; and
   (f) coating a conductive coating on the photosensitive layer to form a conductive layer having different thicknesses,
   wherein the photosensitive coating comprises an organic compound with at least one photosensitive functional group, a solvent, and optionally an additive,
   wherein the organic compound is an acrylate selected from the group consisting of 2-hydroxyethyl methacrylate, tripropylene glycol diacrylate, polyurethane acrylate, and a mixture thereof.

* * * * *